United States Patent [19]
Kumihashi et al.

[11] Patent Number: 5,368,685
[45] Date of Patent: Nov. 29, 1994

[54] DRY ETCHING APPARATUS AND METHOD

[75] Inventors: Takao Kumihashi, Musashino; Kazunori Tsujimoto, Higashiyamato; Shinichi Tachi, Sayama, all of Japan

[73] Assignee: Hitachi, Ltd., Tokyo, Japan

[21] Appl. No.: 36,394

[22] Filed: Mar. 24, 1993

Related U.S. Application Data

[63] Continuation-in-part of Ser. No. 859,336, Mar. 27, 1992, Pat. No. 5,242,539.

[30] Foreign Application Priority Data

Mar. 24, 1992 [JP] Japan ............................ 4-065742
Mar. 25, 1992 [JP] Japan ............................ 4-066916

[51] Int. Cl.$^5$ .................. H01L 21/306; B44C 1/22
[52] U.S. Cl. ..................... 156/643; 156/626; 156/345; 156/657
[58] Field of Search ............ 156/643, 626, 646, 650, 156/345, 651, 657, 662; 204/192.32, 298.31, 298.33, 298.38, 298.37

[56] References Cited

U.S. PATENT DOCUMENTS

| | | | |
|---|---|---|---|
| 5,242,539 | 9/1993 | Kumihashi et al. | 156/643 |
| 5,252,536 | 9/1993 | Schoenborn | 156/643 |

FOREIGN PATENT DOCUMENTS

| | | |
|---|---|---|
| 272140 | 6/1988 | European Pat. Off. |
| 407169 | 1/1991 | European Pat. Off. |
| 52-126174 | 10/1977 | Japan |
| 60-50923 | 3/1985 | Japan |
| 61-61423 | 3/1986 | Japan |
| 63-65628 | 3/1988 | Japan |
| 2052428 | 2/1990 | Japan |
| 2-105413 | 4/1990 | Japan |
| 2-270320 | 11/1990 | Japan |
| 3062517 | 3/1991 | Japan |

OTHER PUBLICATIONS

Journal Electrochemical Society,1982, "Microwave Plasma Etching of Si With CF4 and SF6 Gas", pp. 2764–2769.
Journal Vacuum Science Technology, A7, 1989, "Plasma Characterization for a Divergent Field Electron Cyclotron Resonance Source", pp. 899–902.
Proceedings of 1990 Dry Process Symposium, "ECR Position Etching Technology for ILSI Productions", pp. 99–104.
Journal of Vacuum Science and Technology, B8(6), 1990, pp. 1185–1191.
Journal Vacuum Science Technology, A6, 1988, pp. 2348–2352.
Microelectronic Engineering, vol. 9, 1989, pp. 481–484.
Perry et al, "The Application of the Helicon Source to Plasma Process", Journal Vacuum Science Technology, B9(2), 1991.
1988 Dry Process Symposium, "Highly Selective Etching of Phosphorous-Doped Polycrystalline . . . ", pp. 54–57.
1990 Conference on Solid State Devices and Materials, Extended Abstract pp. 207–210.

Primary Examiner—William Powell
Attorney, Agent, or Firm—Fay, Sharpe, Beall, Fagan, Minnich & McKee

[57] ABSTRACT

At an effective exhaust speed of 1200 liter/s, high frequency power with power surface density of 4.5 W/cm$^2$ is made to discharge high density plasma, thereby carrying out dry etching. With a gas residence time of 100 ms or less, a gas flow rate controller is provided which has a response time substantially equal to the gas residence time. Etching can be performed at high speed with deposit reaction restrained and high ion current density. Because of the enhanced ion current density, etching providing high selectivity can be made with lowered ion energy. The time required for gas exchange in time modulation etching, multi-step etching and attachment/removal of electrostatic adsorption can be shortened to improve the etching throughput.

21 Claims, 7 Drawing Sheets

DRY ETCHING APPARATUS AND METHOD

CROSS-REFERENCE TO RELATED APPLICATIONS

This is a continuation-in-part application of U.S. patent application Ser. No. 07/859,336 filed on Mar. 27, 1992, U.S. Pat. No. 5,242,539, all disclosure of which is incorporated hereby by reference.

BACKGROUND OF THE INVENTION

1. Field of the Invention

The present invention relates to a dry etching apparatus and method, and more particularly to a dry etching apparatus and method which are suitable to implement high-selectivity high-anisotropy etching at high speed and with high throughput.

2. Description of the Related Art

Conventional dry etching techniques have used low gas pressure of 1–10 mTorr or so in order to improve anisotropy. Discharging gas with such a low gas pressure requires adoption of effective discharging techniques. One of them is microwave discharging. Examples of microwave gas discharging are disclosed in "Journal of Electrochemical Society" 1982, page 2764, "Journal of Vacuum Science Technology" A7, 1989, page 899 and "Proceeding of Dry Process Symposium" 1990, page 99.

Generally, reducing pressure lowers etching speed, so the conventional dry etching at low gas pressure uses high density plasma with the degree of ionization being high. The higher the plasma density, the higher the etching speed because the ion current incident to a sample to be treated increases. In microwave discharging, the plasma density can be made high by boosting the power of the microwave.

As an alternative way of improving the anisotropy, the conventional dry etching adopts an exchange of gas. For example, the process disclosed in JP-A-61-61423 and JP-A-63-65628 uses different gases in different steps in such a manner that the first step performs an anisotropic etching, the second step forms a side wall protection film and the third step performs an isotropic etching. The process disclosed in JP-A-60-50923 and JP-A-2-105413 realizes anisotropic treatment by making "time modulation etching" of exchanging etching gas for deposition gas at intervals of a few seconds. The process disclosed in JP-A-2-270320, in order to improve the temperature controllability in lower temperature etching to thereby increase the anisotropy, fixes a wafer by electrostatic adsorption, requires a plasma which (as does the wafer removal). Discharging gas exchanged into inert gas assures more accurate etching. Thus, the efficient method of improving the anisotropy has been to exchange gas.

A dry etching apparatus with the short gas residence time of 25 ms is disclosed in "Journal of Vacuum Science Technology" B8 (1990) p. 1185. The apparatus has a volume of about 2 liters between electrodes and an effective exhaust speed of 80 liter/sec.

The prior art described above has the following problems to be solved. The conventional dry etching techniques show a phenomenon that even when the incident ion current density is enhanced with the density plasma made high, the etching speed of a sample ceases to increase. This causes a problem that the necessary etching speed cannot be obtained solely by making the plasma density high. The etching speed can also be increased by applying an RF bias to a sample or body to be treated to thereby enhance the energy of incident ions. Enhancing the incident ion energy, however, deteriorates the etching selectivity ratio of the sample and a mask or underlying layer.

For example, the Si gate treatment process in which a resist is used as a mask, a poly-Si (polycrystalline silicon) sample having an underlying $SiO_2$ is to be treated and, requires a poly-Si/resist selectivity ratio of 5 or more and a poly-Si/$SiO_2$ selectivity ratio of 50 or more. This treatment process uses $Cl_2$ gas plasma for etching. In order to provide the above selectivity ratios, the plasma etching was performed at the poly-Si etching speed of 300 nm/min or so. Since the poly-Si film is about 300 nm thick, the treatment time including 50% over-etching was 1.5 minutes. But the treatment time is desired to be one minute or less for good throughput. Therefore, the first problem to be solved is:

(1) to realize a poly-Si etching speed of 450 nm/min or more with a poly-Si/resist selectivity ratio of 5 or more and a poly-Si/$SiO_2$ selectivity ratio of 50 or more.

With development of miniaturization of semiconductor devices, the resist mask and the underlying $SiO_2$ is expected to become about half as thick as at the present time. On the other hand, since the thickness of the poly-Si gate is expected to remain fixed, selectivity ratios which are twice as large as before are required. Therefore, the second problem to be solved is:

(2) to realize a poly-Si etching speed of 450 nm/min or more with a poly-Si/resist selectivity ratio of 10 or more and a poly-Si/$SiO_2$ selectivity ratio of 100 or more.

The conventional dry etching technique has a disadvantage that if the sample to be treated contains plural kinds of atoms like AlCuSi, a material with a low gas pressure such as a reaction product of Cu is likely to be left as residue. Therefore, the third problem to be solved is:

(3) to make the etching without leaving, a material with a low gas pressure as residue.

Uniformity in etching depends on the uniformity in the density of the ion current supplied to the sample. But the conventional dry etching has no means of examining the uniformity in the ion current density. Thus, the uniformity in etching cannot be known until the etching is completed. The fourth problem to be solved is:

(4) to estimate and control etching uniformity before the etching.

The conventional dry etching apparatus, in which the gas residence time within a chamber was 0.4–3 sec or so, could not introduce gas in a pulse shape into the chamber at time intervals shorter than the residence time which is the time that the gas resides within the chamber from when it is supplied into the chamber to when it is exhausted. The gas residence time can be calculated by gas residence time=(volume within the apparatus)/(effective exhaust speed)   (1)

In order to implement "atomic layer etching" in which a sample is etched at a sufficient etching speed (100 nm/min or more) for each atomic layer, at a pressure of 0.1 mTorr, it is necessary to control gas adsorption with the accuracy of at least 10 atomic layers, preferably 0.01 atomic layers, for the surface of the sample.

In order to control the gas adsorption with the accuracy of 10 atomic layers, it is necessary to introduce the gas with a pulse width of 100 ms, and in order to control the gas adsorption with the accuracy of 0.01 atomic layers, it is necessary to the gas with a pulse width of 0.1 ms. The fifth problem to be solve is:

(5) to introduce gas in a pulse shape with a pulse width of 0.1 ms to 100 ms into a treatment chamber.

The conventional dry etching apparatus, in which the gas residence time in the treatment chamber is 0.4–3 sec or so, took one second or more to exchange gas. The etching accompanied by gas exchange has a problem that it takes relatively longer time to exchange the gas to thereby reduce the throughput. In order to observe or examine the shape of the sample during the etching by an observing means attached to the etching apparatus, the gas supply must be stopped to reduce the gas pressure. It took a few seconds to exhaust gas so that the etching with observation of the sample shape reduces the throughput. Therefore, the sixth problem to be solved is:

(6) to improve throuput in the etching accompanied by gas exchange.

SUMMARY OF THE INVENTION

The first object of the present invention is to provide a dry etching technique which can realize a poly-Si etching speed of 450 nm/min or more with a poly-Si/resist selectivity ratio of 5 or more and a poly-Si/$SiO_2$ selectivity ratio of 50 or more.

The second object of the present invention is to provide a dry etching technique which can realize a poly-Si etching speed of 450 nm/min or more with a poly-Si/resist selectivity ratio of 10 or more and a poly-Si/$SiO_2$ selectivity ratio of 100 or more.

The third object of the present invention is to provide a dry etching technique which can etch without leaving the material with a low gas pressure as residue.

The fourth object of the present invention is to provide a dry etching technique which can estimate and control etching uniformity before the etching.

The fifth object of the present invention is to provide a dry etching technique which can introduce gas in a pulse shape with a pulse width of 0.1 ms to 100 ms into a treatment chamber.

The sixth object of the present invention is to provide a dry etching technique which can improve throughput in the etching accompanied by gas exchange.

In order to attain the above objects, in accordance with the present invention, the following means for solving the problems described above are proposed.
(1) Means for solving the first problem In the conventional dry etching, when the poly-Si/resist selectivity ratio was 5 and the poly-Si/$SiO_2$ selectivity ratio was 10, with an ion current density of 8 mA/$cm^2$, the etching speed of poly-Si was 300 nm/min. In order to enhance the etching speed with the selectivity ratios fixed, first, it is necessary to increase the ion current density to 12 mA/$cm^2$ which is 1.5 times as large as 8 mA/$cm^2$ without changing the ion energy. To this end, it is necessary to boost high frequency application power to thereby make the plasma density high. Generally, the ion density can be increased to 1.5 times by increasing the high frequency application power to 1.5 times. The necessary application power depends on the area of a sample and the size of a treatment chamber. In order to obtain the same ion current density, a large sample, and this a large treatment chamber, requires large application power. Even with the size of the sample and treatment chamber changed, the same power surface density (high density power per unit area of radiation) results in the same ion current density. The reason why the ion current density depends on the power surface density will be explained below.

The applied high frequency is not absorbed in all parts of a plasma. For example, in microwave discharging, microwave energy is absorbed in the plasma by electron cyclotron resonance (ECR) which occurs at a face portion called an ECR face. Thus, the ion current density depends on the microwave energy (power surface density) radiated for a unit area of the ECR face. In a parallel plate type dry etching apparatus, the ion current density depends on the power surface density of the high frequency energy supplied for a unit area of an electrode. Namely, in the etching apparatus in which the high frequency is absorbed in a face area, the ion current density depends on the power surface density. Generally, the area of the portion where the high frequency is absorbed is almost equal to that of the section of a treatment chamber and also equal to that of a sample to be treated. In other words, the power surface density can be approximated as (applied high frequency power)/(the surface area of the sample).

Also where the high frequency is absorbed in the entire plasma like a helicon wave plasma, the power surface density can be assumed. For example, in the helicon wave plasma, the length of a discharge part depends on the wavelength of the high frequency power, but does not depend on the size of the sample. On the other hand, the sectional area of the discharge part depends on the size of the sample. In order to provide the same ion current density, the applied high frequency power must be increased in proportion to the sectional area of the discharge part. Thus, assuming that (the application high frequency power)/(the sectional area of the discharge part) represents the power surface density, the ion density depends on the power surface density.

Now, the power surface density necessary to raise the etching speed of poly-Si to 450 nm/min will be investigated below. In the conventional dry etching apparatus, with the ion current density of 8 mA/$cm^2$, the etching speed of poly-Si was 300 nm/min. Then, where the sample was an 8-inch wafer, the high frequency power of 1 kW was required. Thus, the power surface density was 3 W/$cm^2$. In order to increase the etching speed of poly-Si to 450 nm/min, the ion current density must be increased to 12 mA/$cm^2$ which is 1.5 times as large as before, and the power surface density of 4.5 W/$cm^2$ is required. In order to obtain this power surface density, where the 8-inch wafer is used, the high frequency application power of 1.5 kW or more is required.

As described in connection with the problem to be solved, the conventional dry etching which only increases the ion density to 1.5 times cannot increase the etching speed. This is ascribed to the influence of the etching reaction product. For example, when the 8 inch Si wafer is etched at 450 nm, the reaction product of Si is made at the rate of $1.3 \times 10^{19}$/s. This rate corresponds to a gas flow of 27 sccm. The conventional dry etching, in which the gas exhaust rate is as low as 760 liter/s or so, permits a gas flow of only 60 sccm at a pressure of 1 mTorr. Thus, half of the gas results in a reaction product. When the plasma density is made high, re-dissociation/re-deposition as well as the ion current density increases. As a result, the etching speed does not increase.

If the reaction product is exhausted outside the treatment chamber by increasing the exhaust speed, the influence by the reaction product is restrained so that the etching speed as well as the ion current density can be increased. Concretely, if the ratio of the reaction product in the gas is reduced to 30% or less, its influence can be restrained. This circumstance corresponds to a gas flow which is three times as much as the amount of the reaction product. In order to realize this, with the gas pressure of 1 mTorr, the $Cl_2$ gas flow must be 90 sccm and the exhaust speed must be 1200 liter/s or more.

In the present invention in which the power surface density is set for 4.5 $W/cm^2$ or more and the effective exhaust speed is set for 1200 liter/s or more, with the selectivity ratios of poly-Si/resist and poly-Si/$SiO_2$ being as high as 5 and 50, respectively, the poly-Si can be etched at the high speed of 450 nm/min.

If the power surface density is raised, the ion current density can be increased to thereby further enhance the etching speed. But if the plasma is ionized completely, further power is not required so that the power may be up to 1000 $W/cm^2$. The exhaust speed is also desired to be higher because the reaction product can be exhausted more swiftly. But, the effective exhaust speed should not exceed 1,000,000 liter/s in view of the size of the apparatus.

(2) Means of solving the second problem

In the feature, with the selectivity ratios of poly-Si/resist and poly-Si/$SiO_2$ being 10 and 100 or more, respectively, which are twice or more as large as before, the etching speed of poly-Si of 450 nm/min or more will be required. In order to enhance the selectivity ratio, the ion energy must be reduced as compared with the condition described in connection with the above item.

(1). If the ion energy is reduced to make the selectivity ratio twice, the etching speed of poly-Si becomes 200 nm/min. Thus, in order to make the etching speed 2.3 times as high as 200 nm/min to provide 450 nm/min, the ion current density must be raised to 27 $mA/cm^2$ which is 2.3 times as high as that in the item (1). This can be realized with a power surface density of applied high frequency of 10 $W/cm^2$ or more to provide an high density plasma.

Even when the ion current density as large as 27 $mA/cm^2$ is given in the conventional dry etching, the etching speed could not be increased because of great influence by the reaction product. In the present invention, since the reaction product is exhausted at the exhaust speed of 1200 liter/s or more, the etching speed of poly-Si can be increased to 450 nm/s. In this case, the sample which is an 8-inch wafer having a surface area of 320 $cm^2$, requires high frequency power of 3.2 kW or more. The sample, which is an 6-inch wafer having a surface area of 180 $cm^2$, requires high frequency power of 1.8 kW or more. The sample which is an 5-inch wafer having a surface area of 130 $cm^2$ requires high frequency power of 1.3 kW or more.

In this way, the present invention can solve the above problem in such a way that the high frequency power of 1.3 kW is applied and also the effective exhaust speed of the treatment chamber is 1200 liter/s.

Additionally, when the high frequency power is applied to generate high density plasma, temperature becomes very high at the wall of the chamber and the sample. To obviate this, the wall of the chamber is made of metal so that it can be cooled by a coolant, and the back surface of the sample is directly touched with the coolant. Thus, the wall of the chamber and the sample can be effectively cooled.

(3) Means of solving the third problem

Also in the material providing the reaction product with low vapor pressure, the reaction creating a reaction product advances even if the incident ion energy is little. For example, in the reaction of $Cl_2$ gas plasma with Cu, chlorination of the Cu surface advances relatively swiftly. If the incident ion energy is little, its reaction product will be left as residue because its vapor pressure is low.

In order to remove the residue of the reaction product, the incident ion energy must be increased. In the prior art technique, the incident ion energy was increased while etching gas was being discharged. This also promotes the etching reaction of the mask, thus providing a small selectivity ratio.

In order to remove the residue of a reaction product, only the incident ion energy has to be high, and a reaction activation species such as $Cl_2$ is not required. In other words, when an inert gas plasma such as Xe is discharged so that ions of the inert gas are incident, it is possible to remove the residue of a reaction product. Then, if an RF bias is applied, the residue can be effectively removed. Further, if the plasma is made more dense to increase the incident ion current, the residue of a reaction product can be removed more effectively.

Thus, since the reaction activation species is not supplied while the inert gas is being discharged, the etching reaction on the mask does not significantly occur, and only the residue of a reaction product can be removed.

In the present invention, since etching is carried out in such a way that the reactive gas and inert gas are alternately discharged, high selectivity is enabled even if the reaction product contains a material with a low vapor pressure.

(4) Means of solving the fourth problem

In accordance with the present invention, plural temperature detection units are located on a sample stage, and discharging conditions are adjusted so that the temperatures at the respective temperature detection units are equal. Since a temperature increase during discharging is proportional to the ion current density at the position at issue, the above adjustment can make the ion current density uniform. Since the etching speed depends on the ion current density, the adjustment can improve etching uniformity. In the prior art technique, in order to adjust the etching uniformity, the etching was actually carried out to investigate the in-plane distribution of the etching speed of the sample. On the contrary, in accordance with the present invention, the conditions which can provide good etching uniformity can be easily obtained for a short time.

(5) Means of solving the fifth problem

If the gas residence time in a treatment chamber is longer than 100 ms as in the conventional dry etching, even if the response speed of a gas flow rate controller is set for 100 ms or less, the gas in a pulse shape with the pulse width of 100 ms cannot be supplied into the treatment chamber because it takes a time approximately equal to the gas residence time from when gas supply is stopped by the gas flow rate controller to when the gas within the chamber is exhausted. In accordance with the present invention, the effective exhaust speed of the chamber which generally has a volume of 100 liters is set for 1000 liter/s or more so that the gas residence time in the chamber is 100 ms or less, and the response time of the gas flow rate controller is set for 100 ms or less so that the gas pulse shape with the pulse width of 100 ms or less can be supplied into the treatment chamber. If the exhaust speed is increased to 1,000,000 liter/s, the pulse width can be shortened to 0.1 ms. But if the exhaust speed is further increased to shorten the pulse width, the control precision of gas adsorption will become as excessively small as a 0.001 atomic layer, which requires a very bulky apparatus.

So, in the present invention, the effective exhaust speed of the treatment chamber is set for a value ranging from 1000 liter/s to 1,000,000 liter/s inclusive so that the gas residence time in the treatment chamber ranges from 0.1 ms to 100 ms inclusive. At least one gas introduction system is provided and the gas flow rate controller having a response time ranging from 0.1 ms to 100 ms inclusive is attached to the gas introduction system. Further, in order to implement high speed pulse control, the gas flow rate controller, discharging means and exhaust speed control means is controlled by a batch controller.

(6) Means of solving the sixth problem

In order to improve throughput in the etching accompanied by gas exchange, it is necessary to shorten the time taken for the gas exchange. Where the used gas is exchanged from gas A to gas B during the etching, the etching using gas B must be performed after gas A is sufficiently exhausted. If not, in the gas exchange, the gases A and B mix with each other, deteriorating the etching characteristic. If the exhaust is carried out for a sufficiently long time, the pressure reduces to the base pressure in the apparatus. But this deteriorates the throughput extremely so that actually, the next gas is introduced when the gas exhaust of about 95% is completed. The pressure changes as shown in FIG. 4 during the time from when gas A is stopped to when gas B is introduced.

The change in the pressure from the stopping of gas A to completion of its exhaustion accords with the differentiation equation expressed by $$dP/dt = -SP/V \quad (3)$$

where P represents pressure, S represents an effective exhaust speed in the treatment chamber and V represents the volume of the chamber. With the stopping time of gas A at t=0, solving the above equation provides the time until the gas pressure becomes the pressure after exhaust in FIG. 4 (exhaust time) expressed by $$\text{exhaust time} = (V/S) \ln (\text{pressure before exhaust/pressure after exhaust}) \quad (4)$$

Since (V/S) represents the gas residence time, the exhaust time can be expressed by $$\text{exhaust time} = \text{residence time} \times \ln (\text{pressure before exhaust/pressure after exhaust}) \quad (5)$$

FIG. 6 is a graph showing the relationship of the rate of gas exhausted outside the chamber and ln (pressure before exhaust/pressure after exhaust). When gas is exhausted for the residence time after gas supply is stopped, only 60% of the gas remaining in the chamber is exhausted. As seen from the graph of FIG. 6, the gas exhaust of 95% corresponds to 1 n (pressure before exhaust/pressure after exhaust) of 4. Thus, unless the gas exhaust is carried out for four times as long as the gas residence time, 95% of the remaining gas cannot be exhausted.

In the conventional dry etching apparatus, in which the residence time was 1 second or so, an exhaust time of several seconds was required. On the other hand, in the present invention, since the effective exhaust speed is set for 1000 liter/s so that the residence time is 100 ms or less, the exhaust time can be shortened to about one-tenth as long as before. As a result, the gas exchange time can be shortened to improve throughput.

By using the respective means described above, the present invention permits high-anisotropic etching to be performed with high selectivity and at high speed. Because of provision of the batch controller for controlling the discharging means and exhaust speed control means as well as the gas flow rate controller, the present invention permits high precision etching to be performed with high throughput.

Further, in accordance with the present invention, means for recovering gas after the etching is completed is provided to separate and recover unused gas so that costs necessary to remove harmful components can be reduced.

The present invention, in which means for observing a sample is provided, permits high precision etching to be performed with high throughput.

The present invention, in which means for observing a sample is provided, permits high precision etching to be performed while monitoring an etched shape. In this case, since the time taken for gas stopping and pressure reduction can be decreased to 100 ms or less, the etching can be carried out while monitoring the etched shape without reducing the throughput.

DESCRIPTION OF THE PREFERRED EMBODIMENTS

Embodiment 1

Figure 1:
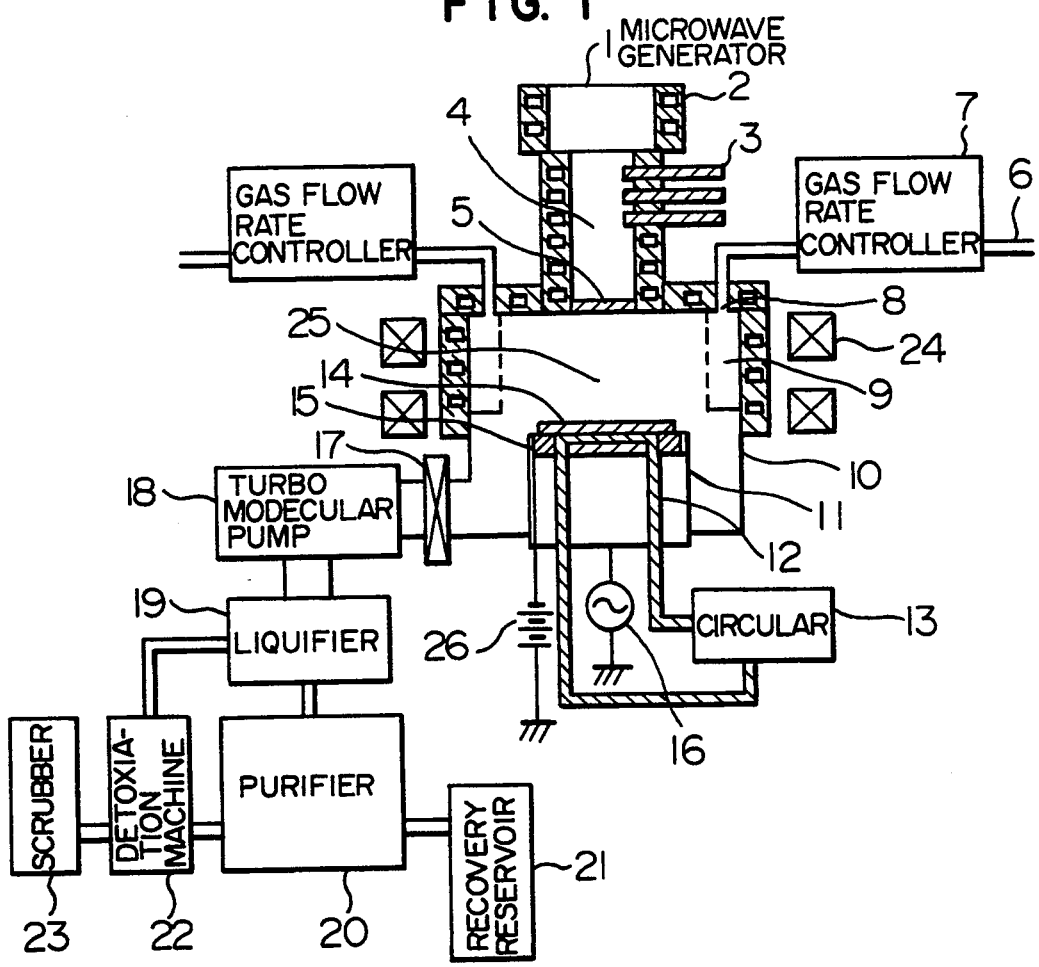
FIG. 1 is a block diagram showing the arrangement of a dry etching apparatus according to one embodiment of the present invention.

An explanation will be given of one embodiment of the dry etching apparatus according to the present invention. FIG. 1 shows the arrangement of one embodiment of the dry etching apparatus according to the present invention. In this apparatus, microwave energy is generated by a microwave generator 1. The microwave energy is radiated into a discharging part 25 located in a vacuum treatment chamber 10 through a waveguide 4 and a microwave introduction window 5. The wafer to be etched is an 8-inch wafer having a surface area of 320 cm$^2$. In accordance with the present invention, the microwave generator 1 is activated so that the power surface density of the microwave energy for the 8-inch wafer becomes 4.5 W/cm$^2$. For this purpose, a microwave generator having maximum activation power of 1.5 W or more is used to discharge high density plasma. Thus, the walls of the microwave generator 1, waveguide 4 and discharging part 25 generate more heat than in the conventional dry etching apparatus. In order to absorb the heat, a cooling mechanism 2 through which coolant flows is provided to cool the apparatus. In order to radiate the activated microwave power effectively to the discharging part 25, sticks 3 for tuning are provided on the way of the waveguide 4.

Etching treatment gas, the flow rate of which is controlled by a gas flow rate controller 7, is introduced from a gas conduit 6 via a gas inlet 8 into the discharging part 25. In order to lower the gas flow rate to thereby introduce the gas into the discharging part 25 uniformly, a buffer chamber 9 is provided between the gas introduction inlet 8 and the discharging part 25. The gas is introduced into the discharging part 25 through a large number of mesh-like pores made in the wall of the buffer chamber 9.

In order that the introduced etching gas is effectively discharged by the microwave energy, a magnetic field is produced by solenoid coils 24 so that because of ECR (electron cyclotron resonance) the microwave energy is effectively absorbed in the plasma.

The gas after the etching treatment is completed is exhausted from the vacuum treatment chamber 10 by a turbo molecular pump 18 via a conductance valve 17. In the dry etching apparatus according to this embodiment, the gas is supplied with a large flow rate so that only 30% or less of the entire gas flow is consumed in an etching reaction, and 70% or more thereof is exhausted as unused treatment gas by the turbo molecular pump 18. So, a means for recovering the unused treatment gas of the exhausted gas is provided. The treatment gas is liquefied by a liquefaction machine 19, and the liquefied gas is purified by a purifier 20. The unused treatment gas thus separated is recovered by a recovering reservoir 21.

The liquefier 19 liquefies the unused treatment gas by adjusting pressure and temperature. The purifier 20 separates the unused treatment gas from the other gas by distillation. The used gas (reaction product) separated by the liquefier 19 and purifier 20 is passed through a detoxication machine 22 and a scrubber 23 and released in the atmosphere. As described above, the unused gas is recovered so that little harmful etching gas will pass through the detoxication machine 22. The frequency of exchanging the adsorbent in the detoxication machine 22 can thus be reduced from 12-times/year to once/year or less. Since the recovered gas can be used again, cost for the gas and detoxication can be restricted.

The wafer 14 to be etched is placed on a sample stage 11. The sample stage 11 is provided with a cooling line 12 for the sample to be treated. The cooling line 12 is opened at the upper portion of the stage 11 so that coolant directly contacts with the back surface of the wafer 14. The coolant is cooled by a circulator 13 to circulate in the cooling line 12. The coolant directly contacts with the back surface of the wafer 14, but the coolant must not leak into the vacuum treatment chamber 10. So in this embodiment, using a dielectric 15 and a DC power source, the sample stage 11 and the wafer 14 are brought into intimate contact with each other by electrostatic adsorption.

An RF power source 16 can be connected with the sample stage 11 so that an RF bias can be applied to the wafer 14.

Also using high density plasma, this embodiment can carry out the etching with the influence by the reaction product being restrained. For example, under the conditions of the Cl$_2$ gas pressure of 1 mTorr, gas flow rate of 90 sccm, microwave power of 1.5 kW and power surface density of 4.5 W/cm$^2$, the etching can be carried out at the poly-Si etching speed of 450 nm/min to provide a poly-Si/resist selectivity ratio of 5 and a poly-Si/SiO$_2$ selectivity ratio of 50.

The above meritorious effect is true of etching other materials as well as the resist mask and Si. The conditions which make side etch for the metal or semiconductor such as Al, W, Cu and GaAs does not make the side etch for the insulating material such as SiO$_2$. In other words, an etching reaction occurs with the lower incident ion energy for the metal or semiconductor than for the insulating material. Where the metal or semiconductor is etched using the insulating material as a mask, the same effect as in this embodiment can be obtained.

Embodiment 2

In the apparatus according to Embodiment 1, the high ion current density permits etching with improved uniformity. The uniformity of the ion current density can be regulated using an etching parameter such as an exterior magnetic field condition. This embodiment proposes the means and method for regulation.

Since ions accelerated by plasma potential are incident, an incident portion is heated by Joule heating so that its temperature is increased. The degree of temperature increase depends on the ion current density. Thus if the exterior magnetic field condition is regulated so that the temperatures in the plural temperature detection units previously provided on the stage 11 are equal, the uniformity of the ion current density can be increased.

Figure 2:
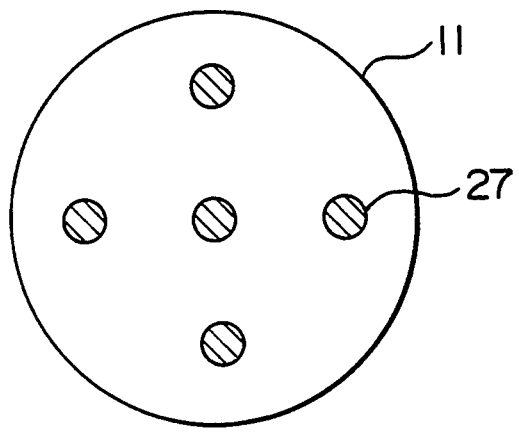
FIG. 2 is a plan view showing the arrangement of plural temperature detection units on the sample stage in one embodiment of the present invention.

FIG. 2 shows the layout of the temperature detection units on the stage. As seen from the figure, plural temperature detection units 27 are placed on the stage 11. In this embodiment, the temperature detection units 27 detect the temperature of SiO$_2$ serving as covers from its back face by means of contact-type fluorescent thermometers. The temperatures at the respective positions are detected during the discharging, and the exterior magnetic field is regulated so that these temperatures are equal. The exterior magnetic field condition can be regulated by regulating the current which is caused to flow through a solenoid coil 24 (FIG. 1) and the position of the coil. By means of the above regulating means and method, the uniformity of the ion current density can be improved, which leads to etching with improved uniformity.

In order that the conventional dry etching can enhance etching uniformity, the sample must be actually etched to acquire the in-plane distribution of the etching speed. For this reason, it took time and labor to optimize the exterior magnetic condition. By the method according to this embodiment, the exterior magnetic field condition can be optimized for a short time for each process so that the time and cost necessary for regulation can be reduced.

In addition to the exterior magnetic field condition, the regulation parameter may be the position where the tuning sticks for matching the microwave energy are located, the propagation mode of the microwave energy, the position where the dielectric is placed in the discharging chamber, microwave input power and the kind of energy to be radiated. The method according to this embodiment can also be applied to regulation of these parameters.

Embodiment 3

As described in connection with Embodiment 1, the present invention can carry out the high-speed high-selectivity etching by increasing the amount of incident ions without changing the ion energy. But it has a problem that when the sample to be etched contains plural kinds of atoms, a reaction product with a low gas pressure remains as residue. For example, in the etching of the AlCuSi, the reaction product of Cu is likely to remain as a residue. So in the conventional dry etching technique, a high RF bias was applied to prevent the reaction product with low vapor pressure from remaining as a residue. But, this gave rise to a problem that the selectivity ratio with the mask becomes small because the incident ion energy is high.

In order to desorb the reaction product with low vapor pressure, the amount of incident ions may be increased instead of increasing the incident ion energy. But in this case, the reaction product with high vapor pressure is likely to be further desorbed so that the reaction product with low vapor pressure still remains as a residue.

To obviate this, in accordance with this embodiment, the steps of supplying low incident ion energy and high incident ion energy are repeated alternately. Then, the step of low incident ion energy discharges reactive gas whereas the step of high incident ion energy discharges inert gas. Such a technique realizes the high-speed high-selectivity etching without substantially leaving a residue. This etching technique will be explained for an example of etching of AlCuSi using a resist mask.

The step of supplying low incident ion energy discharges $Cl_2$ gases. The same process condition as in Embodiment 1 is adopted. Making the plasma dense restrains the etching reaction of the resist mask so that the etching reaction of AlCuSi can occur. Then, the reaction products of Al and Si, which have high vapor pressure, are desorbed. But the reaction product of Cu, which has low vapor pressure, remains as a residue in a great amount.

In order to desorb this residue, incidence of ions with high energy is required. So the inert gas is discharged and RF bias is applied so that the inert gas with high energy is incident. The energy desorbs the residue of the reaction product. But discharging the inert gas does not bring about the etching reaction so that the material other than the reaction product of Cu is not desorbed. In the conventional dry etching, the reactive ions which cause its etching reaction are incident with high energy under the condition of causing an etching reaction so that the resultant selectivity ratio was small. On the other hand, in this embodiment, the etching reaction is caused by the low ion energy, and the residue of the reaction product is desorbed by the high energy of the inert gas ions in an inert atmosphere. Thus, this embodiment can realize the high-speed high-selectivity etching with no residue.

In this embodiment, Xe gas is used for discharging the inert gas. The reason why Xe is used is that since it has a mass nearly approximate to that of Cu, its incident energy can effectively reach the reaction product. Pressure of 1 mTorr, gas flow rate of 90 sccm and microwave power of 1.5 kW are set so that the ion current density of 12 mA/cm$^2$ or more can be attained with no influence by the reaction product. The RF bias is applied with 100 W at 2 MHz.

Discharging of $Cl_2$ gas and that of Xe gas are repeated alternately each by 1 sec. As a result, the etching speed for AlCuSi is 450 nm/min whereas that for the resist mask is 45 nm/min so that etching with a selectivity ratio of 10 can be carried out.

By repeating the above two steps, even where the sample to be etched contains plural kinds of elements such as AlCuSi and some of its reaction products have low vapor pressure, the high-speed high-selectivity etching can be performed. Although etching for AlCuSi was explained in this embodiment, this effect is true of samples other than AlCuSi. Also, in etching only Cu, discharging of the reactive gas and inert gas may be repeated alternately to promote desorption of reaction products.

Embodiment 4

Figure 3:
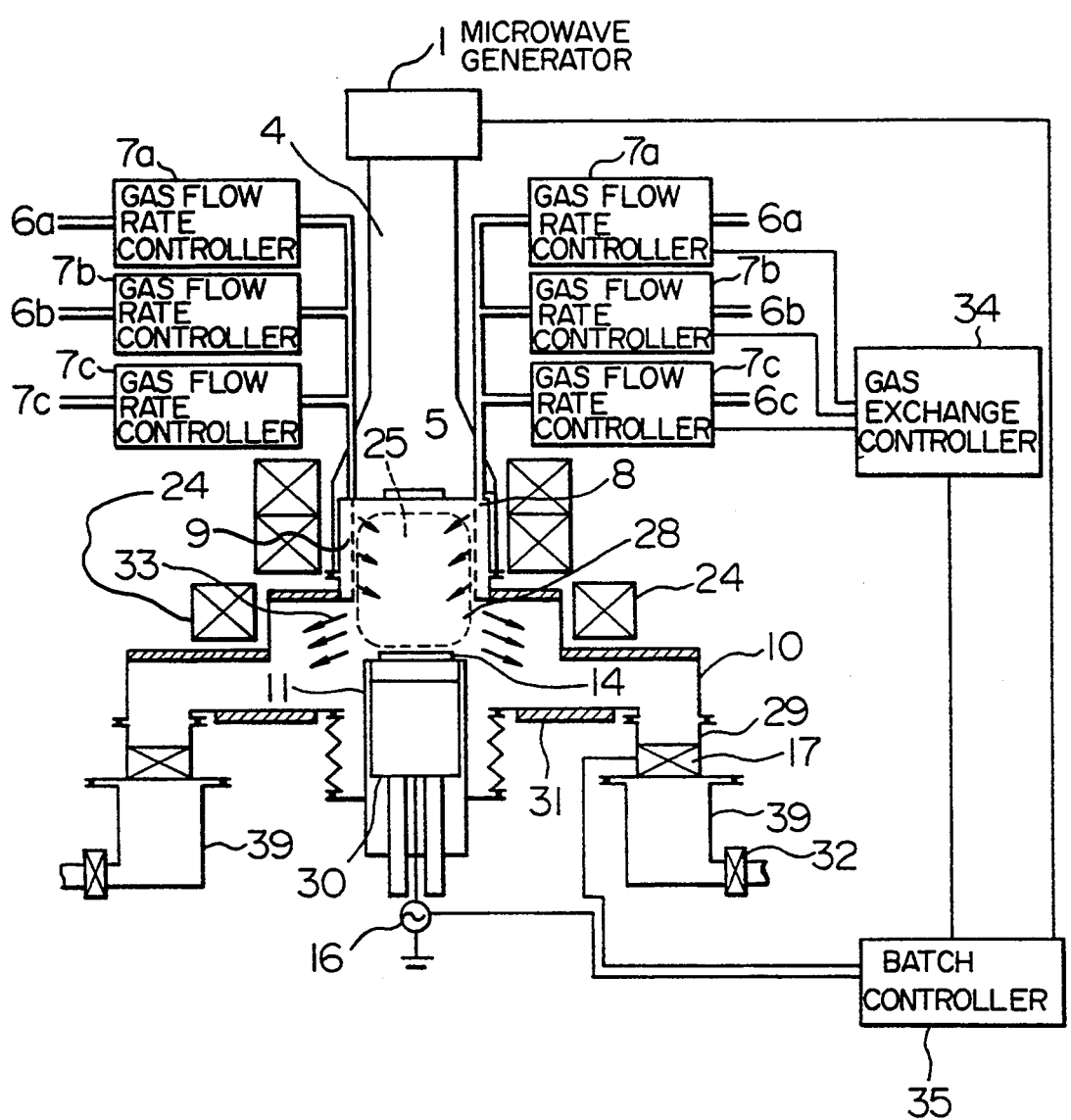
FIG. 3 is a sectional view of the dry etching apparatus according to another embodiment of the present invention.
Figure 4:
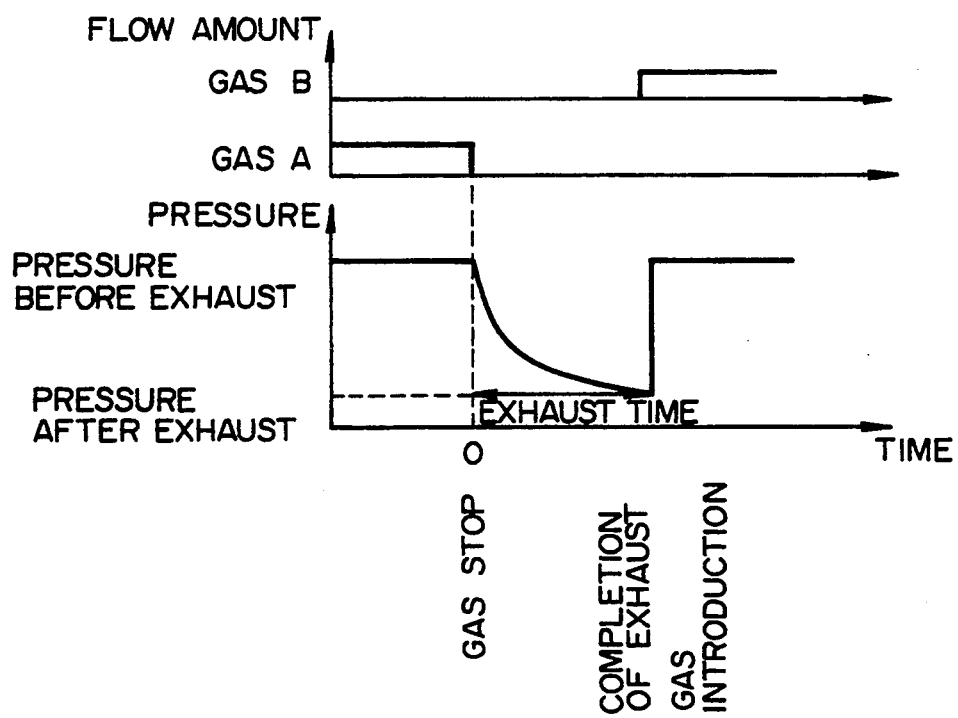
FIG. 4 is a timing chart for gas exchange.

An embodiment of the dry etching apparatus according to the present invention is shown in FIG. 3. In this apparatus, etching gas is introduced into a vacuum treatment chamber 10. High frequency radiation of 2.45 GHz is generated by a microwave generator 1, and the generated high frequency power is carried to a discharging unit 25 through a waveguide 4 and a microwave introduction window 5 to generate gas plasma 28. For the purpose of high efficiency discharging, a solenoid coil 24 for generating a magnetic field is placed around the discharging unit 25, and using ECR with a magnetic field of 875 Gauss, high density plasma is generated. A sample stage 11 is located near the discharging part 25. A wafer 14 located on the stand 11 will be etched by gas plasma.

The etching gas is introduced from a gas introduction inlet 8 into the discharging part 25, passed through a vacuum treatment chamber 10 and exhausted from an exhaust conduit 29 by an exhaust pump outside the chamber 10. Then, using a conductance valve 17, the exhaust speed can be varied. An auxiliary pump (not shown) is connected with the stage succeeding to the exhaust pump 39 through a butterfly valve 32.

The sample stage 11 on which the wafer is placed is provided with a cooling mechanism 30 which can cool the wafer to 0° C. or less. An RF power source 16 can apply an RF bias at 400 kHz to 13.56 MHz.

The vacuum treatment chamber 10 includes a heater 31 which can perform a baking treatment of heating the temperature within the vacuum treatment chamber 10 to 50° C. or more. Thus, the residual gas component on the wall of the vacuum treatment chamber and a deposit of the reaction product with relatively low vapor pressure can be removed to provide the base pressure of 0.1 $\mu$Torr which is 1/10 or less as large as before. For this reason, etching under a pressure as low as 0.1 mTorr can realize clean etching with the impurity gas component restrained to 1/1000 or less.

Two turbo pumps comprise the exhaust pump 39, each having an exhaust speed of 1000 liter/s to provide a total exhaust speed of 2000 liter/s, and are arranged symmetrically with the center axis of the discharge part 25. The total exhaust conductance of the discharging part 25, vacuum treatment chamber 10, exhaust conduit 29 and conductance valve 17 is designed to be 2000 liter/s. The effective exhaust speed can be expressed by $$1/(\text{effective exhaust speed}) = 1/(\text{exhaust speed of pump}) + 1/(\text{total exhaust conductance}) \qquad (6)$$

In this embodiment, the effective exhaust speed is 1000 liter/s. Further, the total volume of the discharging part 25, vacuum treatment chamber 10 and exhaust conduit is designed to be as small as 100 liters so that the gas residence time within the vacuum treatment chamber is 100 msec. As a result, the exhaust time can be shortened; for example, the time required for 95% exhaust is 400 msec or so. Since the conventional apparatus requires 1 to 6 sec or so to achieve 95% exhaust, this embodiment can shorten the exhaust time to $\frac{1}{3}$ to 1/15. This shortens the time required for gas exchange to thereby improve the throughput of etching.

The treatment gas is supplied through gas conduits 6a, 6b and 6c via gas flow rate controllers 7a, 7b and 7c, and introduced from the gas introduction inlet 8 into the discharging part 25 through a buffer chamber 8 with mesh-like pores. Since the buffer chamber 8 is provided and the gas opening area is increased by the mesh-like pores, the gas flowing speed in gas introduction can be reduced to one-third or less as large as the speed of sound to provide uniform flow at 33. Where the gas is introduced into the discharging part 25 through the gas conduits 6a, 6b and 6c, the gas introduction inlet 8 is arranged at two or more positions symmetrically with respect to the center axis of the discharging part 25. This serves to restrain slanting of the gas distribution in the gas plasma 28.

In order that a treatment gas to be introduced into the discharging part 25 can be exchanged, plural gas flow rate controllers 7 and gas conduits 6 are provided. Different kinds of gas sources are connected with different gas conduits. A gas mixing device may be connected with the gas conduits so that a mixed gas can be supplied.

In this embodiment, three conduit systems are arranged. The response time of the gas flow rate controllers 7a, 7b and 7c is set for 100 ms which is equal to the gas residence time. Thus, the kind of gas can be exchanged immediately after the exhaust of gas is completed. An explanation will be given of the effect resulting from setting the response time of the gas flow rate controller so that gas A and gas B are alternately introduced into the discharging part 25.

Figure 7:
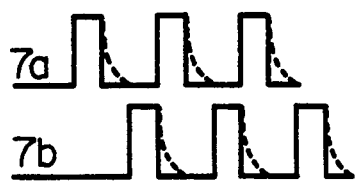
FIGS. 7 and 8 (a)-(b), are timing charts for gas exchange.
Figure 8:
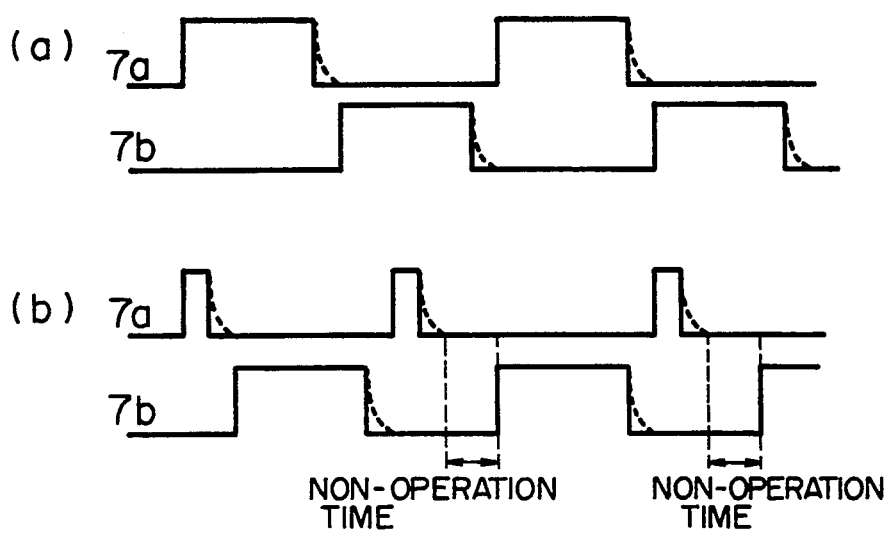

If the response time of the gas flow rate controller 7 is 100 ms, the gas can be introduced in a pulse shape at the timings as shown in FIG. 7. If the response time of the gas flow rate controller 7 is as slow as 1 sec or so, the gas flow rate controller cannot be set for an exchange for a time shorter than 1 sec. Thus, as shown in FIG. 8A, the width and interval of the pulse cannot be set for 1 sec or less. If the response time of the gas flow rate controller 7a which is 100 ms is different from the response of the gas flow rate controller 7b which is IS, as shown in FIG. 8B, gas B cannot be introduced although gas A has been sufficiently exhausted. As a result, this provides a non-operation time.

If the gas flow rate controller has a response time substantially equal to the gas residence time, the effect of the present invention of shortening the exhaust time can be fully shown.

In accordance with this embodiment, when the gas residence time of 100 ms or less is given and a gas flow rate controller having a response time of 100 ms or less is used, the gas adsorption on a solid surface can be controlled with a precision of 10 (ten) or fewer atomic layers so that high precision etching such as atomic layer etching can be performed.

In the apparatus shown in FIG. 3, the gas flow rate and gas flow-in timing in the gas flow rate controllers 7a, 7b and 7c can be controlled by a gas exchange controller 34. The timing of gas flow-in can also be further controlled by a stop valve (not shown), the opening/closing of which can be controlled by the gas exchange controller 34.

The gas exchange controller 34 is connected with a batch controller 35 so that the operation timing of the gas exchange controller 34 can be controlled by the control signal supplied from the batch controller 35. The batch controller 35 is connected with the microwave generator 1, an RF power source 16 and a conductance valve 17 so that their control conditions and operation timing can be collectively controlled. In this way, provision of the gas exchange controller 34 and the batch controller can enhance the efficiency of exchanging gas. The microwave power and RF bias can also be simultaneously controlled so that "time modulation etching" and "multi-step etching" can be performed with high throughput and high efficiency.

Figure 5:
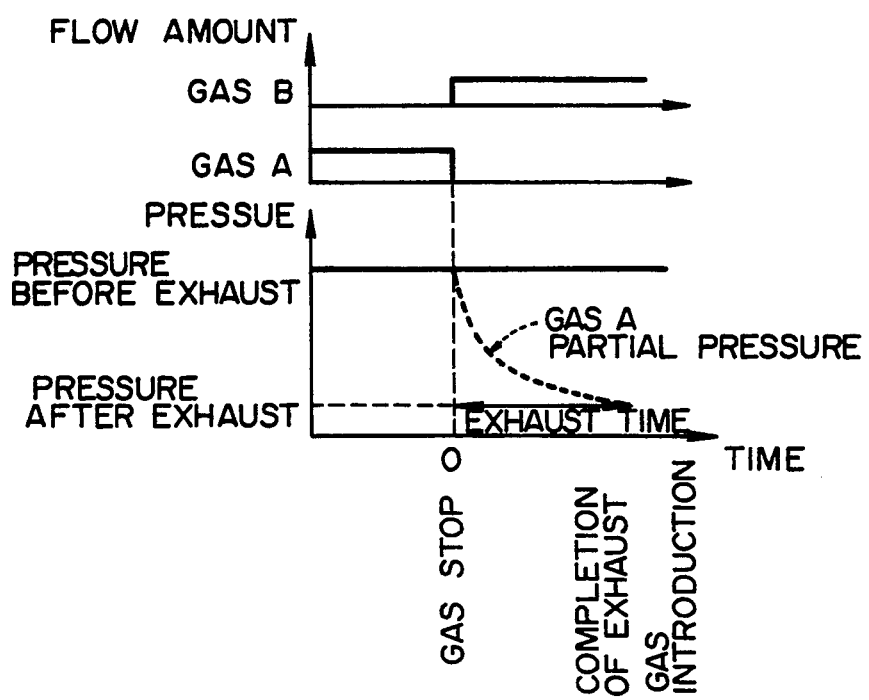
FIG. 5 is a timing chart for gas exchange.

If the batch controller 35 is provided with a memory means which stores a relationship between the opening degree of the conductance valve 17 and the effective exhaust speed, the exhaust time can be calculated. In gas exchange by controlling the conductance valve 17 for pressure control, the gas change can be carried out with great accuracy using the exhaust time previously memorized. For example, as shown in FIG. 5, unless the gas flow is stopped in gas exchange, completion of the exhaust cannot be monitored by a pressure change. If the exhaust time can be previously known, influence by gas mixing can be restrained by stopping supply of the microwave power for that time.

Embodiment 5

In the conventional time modulation etching, side etching was produced during an etching step because the time of one etching step was long. In order to restrain the side etching, a deposition film was formed. But in this case, the side etching and the deposition occurred alternately so that a level difference or bump was generated at a side wall. Growing films such as a capacity film on the bump provided the problems that the film thickness was not uniform and the leak current was large. So, in accordance with this embodiment, a time modulation etching is proposed which uses very high speed pulses for gas introduction. This time modulation etching does not produce a level difference at a side wall. Specifically, gas introduction using a very high speed pulse of 10 ms or less, preferably 10 ms serves to realize the time modulation etching providing a vertical and flat side wall.

As described previously, it takes four-times as long as the gas residence time to exhaust 95% of the gas after gas introduction is stopped. In order that the gas introduction can be performed using a pulse of 10 ms, the gas residence time must be set for 2.5 ms or less which is $\frac{1}{4}$ as long as the pulse. In accordance with this embodiment, although the apparatus has the arrangement as shown in FIG. 3, the volume of the vacuum treatment chamber 10 of 10 liters, the exhaust speed of the pump of 10,000 liter/s, and the total exhaust conductance of 10,000 liter/s are set. The effective exhaust speed of 5,000 liter/s and the gas residence time of 2 ms are also set.

As one embodiment of the time modulation etching using a very high speed pulse for gas introduction, an explanation will be given of trench etching of Si in which etching in an atomic layer level is done by $Cl_2$ gas plasma and a side wall protection film in the atomic layer level is done by $O_2$ gas plasma.

Figure 12:
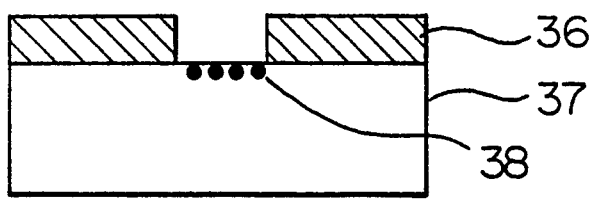
FIGS. 12(a)-(d) are flow charts showing one embodiment of very high speed pulse time modulation etching.
Figure 12:
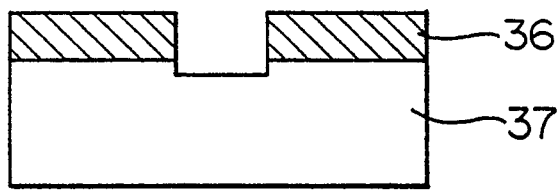
Figure 12:
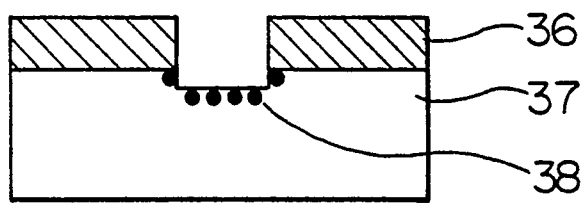
Figure 12:
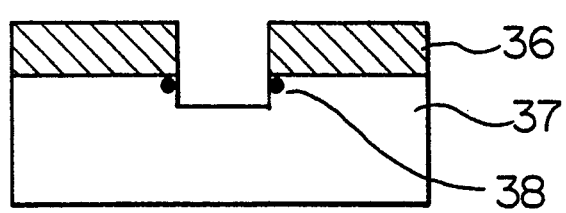

The sample to be treated in this embodiment is an Si substrate 37 with an $SiO_2$ mask patterned thereon as shown in FIG. 12A. The pattern width is 0.1 $\mu m$ and the thickness of the $SiO_2$ mask is 500 nm.

The first step in the time modulation etching is to etch Si by the $Cl_2$ gas plasma. Then, the discharging conditions include a pressure of 0.5 mTorr, gas flow rate of 200 sccm, microwave power of 2 kW, RF bias of 20 W at 2 MHz, and wafer temperature of 10° C. Then, the etching speed of Si is 600 nm/min and the etching selectivity ratio of $Si/SiO_2$ is 50. It should be noted that there is a very thin oxide film 38 on the Si surface immediately after the etching is started. Although this film is not significantly etched unless the RF bias is not applied, application of the RF bias of 20 W at 2 MHz in this embodiment only retards the etching speed of Si by ten percent or so.

When the wafer temperature is 10° C., the Si etching by the $Cl_2$ gas plasma generates side etching. But since the etching speed in a vertical direction is much higher than that of the side etching, the side etching does not significantly occur while the etching of the layer of several atoms of Si is being advanced. Since the thickness of the layer of one atom of Si is about 0.2 nm, the etching for 10 ms etches the layer of one atom of Si as shown in FIG. 12B.

Then, the gas flow rate controller 7 stops the supply of $Cl_2$ gas and starts to supply $O_2$ gas. After 8 ms, 95% of the $Cl_2$ is exhausted. If the microwave power is stopped before the $Cl_2$ gas is stopped, discharging is stopped and only the etching of the one atomic layer advances. Then, even if the microwave power is not stopped, the discharging is stopped because of pressure reduction after 8 ms, so that it is not necessary to stop the microwave power. But, the $Cl_2$ gas must be exhausted before supply of the $O_2$ gas is started.

The next step is the processing by the $O_2$ gas plasma which forms a very thin oxide film 38 on the Si surface as shown in FIG. 12C. Then, the discharging condition is the pressure of 1 mTorr, gas flow rate of 90 sccm, and microwave power of 2 kW. The oxide film 38 on the side wall surface serves to restrain side etching. The thickness of the oxide film 38 may correspond to several atoms so that the treatment has only to be carried out for a time ranging 10 ms to 100 ms. Additionally, during the treatment, if an RF bias is applied, oxygen ions with high energy are incident to the bottom surface so that a thick oxide film in an advanced oxidation state is formed on the bottom surface. This hinders the etching reaction. Therefore, in the $O_2$ gas plasma treatment, no RF bias should be applied. After the $O_2$ gas plasma treatment is completed, introduction of the $O_2$ gas is stopped and supply of the $Cl_2$ is started. After 8 ms, 95% of the $O_2$ gas is exhausted so that the treatment may be advanced to the subsequent step. The steps described above constitutes one cycle in this embodiment.

The subsequent step is to etch the one atomic layer of Si by the $Cl_2$ gas plasma as described above. Then, as shown in FIG. 12D, the oxide film 38 on the side wall serves as a side wall protection film. Since the thickness of the newly etched portion is only the thickness corresponding to one atomic layer, side etching does not occur.

If the steps described above are repeated, a thin oxide film is formed on the side wall to restrain the side etching. Since the etching amount during one etching step by the $Cl_2$ gas is set for the thickness corresponding to the layer of one atomic of Si, the etching step is not accompanied by side etching. Such an effect makes it possible to perform the trench etching accompanied by no side etching and providing a flat side wall. Specifically, under the conditions of the selectivity ratio of 50 (Si/the $SiO_2$ mask 36) and the etching speed of 600 nm/min during the etching step, a trench having a depth of 1 $\mu m$ can be formed by etching for six minutes.

In this embodiment, since the etching amount during one etching step is controlled to be the thickness corresponding to a one atom layer, the width of the gas pulse is set for 10 ms or so. Even if the etching amount during one etching step is increased to a layer of ten atoms or so, side etching is made in the thickness corresponding to only one or two atoms at most. The above effect can be therefore obtained also when the time of the etching step is set for 100 ms or so. Further, for oxidation treatment by the $O_2$ gas plasma of up to 100 ms or so, the oxide film formed on the bottom surface only hinders the etching to the extent that the etching speed is retarded by several tens percent. Thus, with the gas pulse width of 100 ms, the effect described above can be obtained. In this case, the apparatus can be designed so that the gas residence time is 20 ms or so. This permits a pump with a low exhaust speed to be used.

A conventional technique used a mixed gas of $Cl_2/O_2$ for the Si trench etching. In this conventional technique, a reaction product reacted with $O_2$ so that an oxide was deposited on a wafer. The oxide deposit served as a side wall protection film which allowed anisotropic etching. But this deposit also caused reduction in pattern width and particle pollution. In this embodiment, for two reasons that the etching amount during one etching step is the layer corresponding to several atoms, and because the reaction product does not react with $O_2$ to prevent a deposit from being formed, influence by the deposit does not occur.

In this embodiment, the Si trench etching using $Cl_2$ gas and $O_2$ gas was explained. But the effect according to this embodiment can also be obtained for gate etching of poly-Si. Any gas combination, as long as it is a combination of etching gas and deposition gas for forming a film, may be used.

Embodiment 6

As another embodiment of the dry etching method according to the present invention, an explanation will be given of time modulation etching.

The time modulation etching performs the etching by using etching gas and deposition gas alternately. This restrains a "microloading effect".

Figure 9:
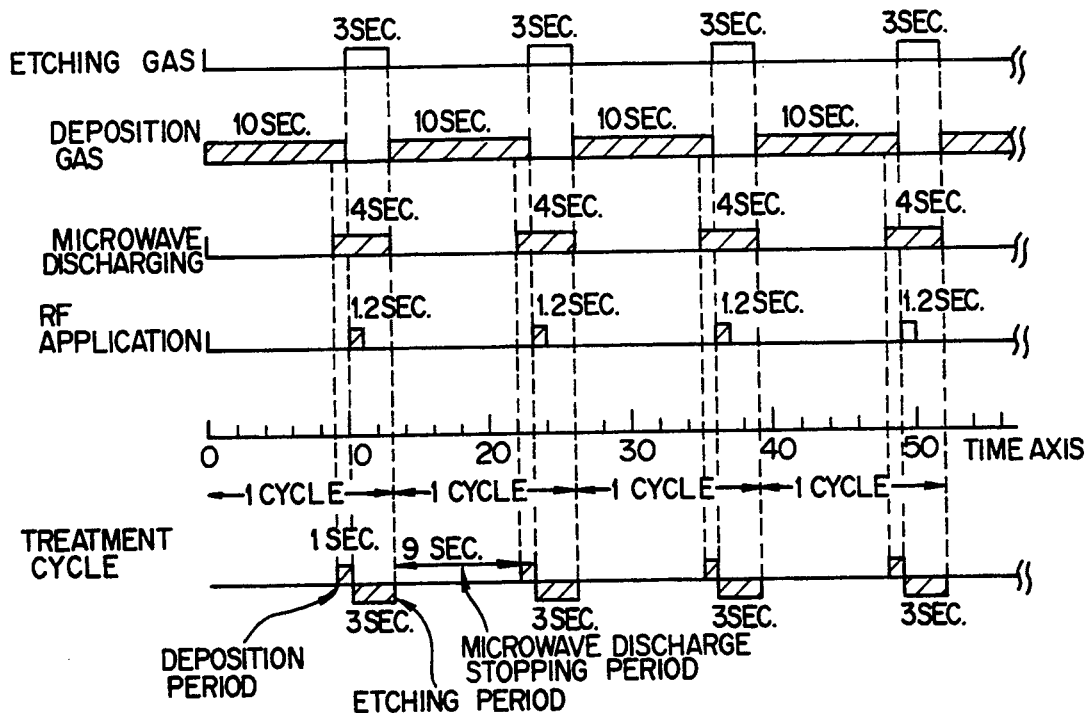
FIG. 9 is a timing chart of the time modulation etching according to the prior art.

The timing chart of the conventional time modulation etching is shown in FIG. 9. This example is disclosed in JP-A-2-105413 as an embodiment. The etching is advanced by using the etching gas and the deposition gas alternately. Supply of the deposition gas intends to form a deposit on the wafer. But immediately after the gas is exchanged, the etching gas still remains. Thus, if the microwave discharging is caused immediately after the gas exchange, influence by the etching gas will occur. This provides a problem that the etching but not the deposition will still occur. For example, where polycrystalline Si is to be etched using $SF_6$ as etching gas and $CCl_4$ as deposition gas, inclusion of 5% or more of the etching gas in the deposition gas deteriorates the characteristic of the time modulation etching. So the deposition must be carried out after 95% of the etching gas is exhausted.

Figure 6:
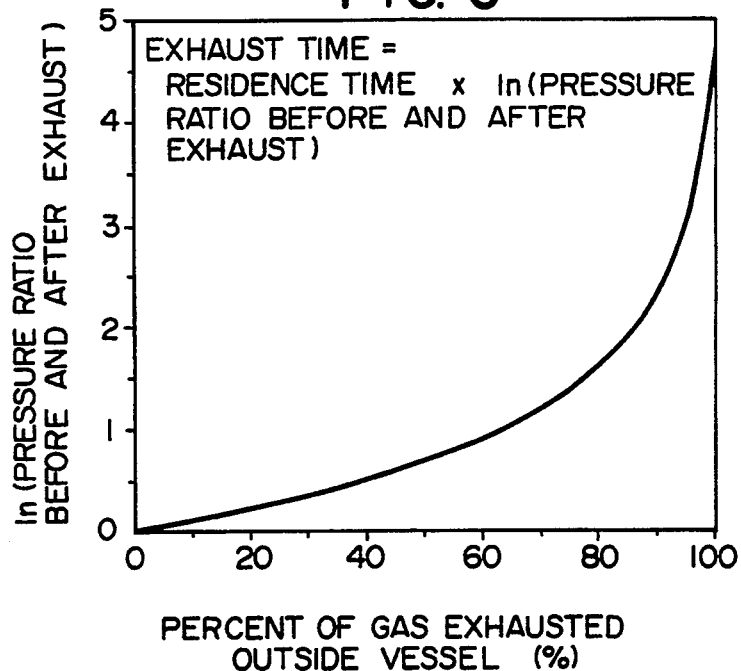
FIG. 6 is a graph showing the relationship of the rate of exhausted gas and the natural logarithm of pressure ratio.

As seen from the graph of FIG. 6, it takes four times as long as the gas residence time to exhaust 95% of the gas. Since the gas residence time in the conventional dry etching apparatus was 1.5 sec or so, an exhaust time of at least 6 sec was required. In the example shown in FIG. 9, microwave discharging is stopped for 9 sec.

In the present invention, the gas residence time is controlled to be 100 ms or less so that an exhaust time of only 0.2 sec or less is required.

Figure 10:
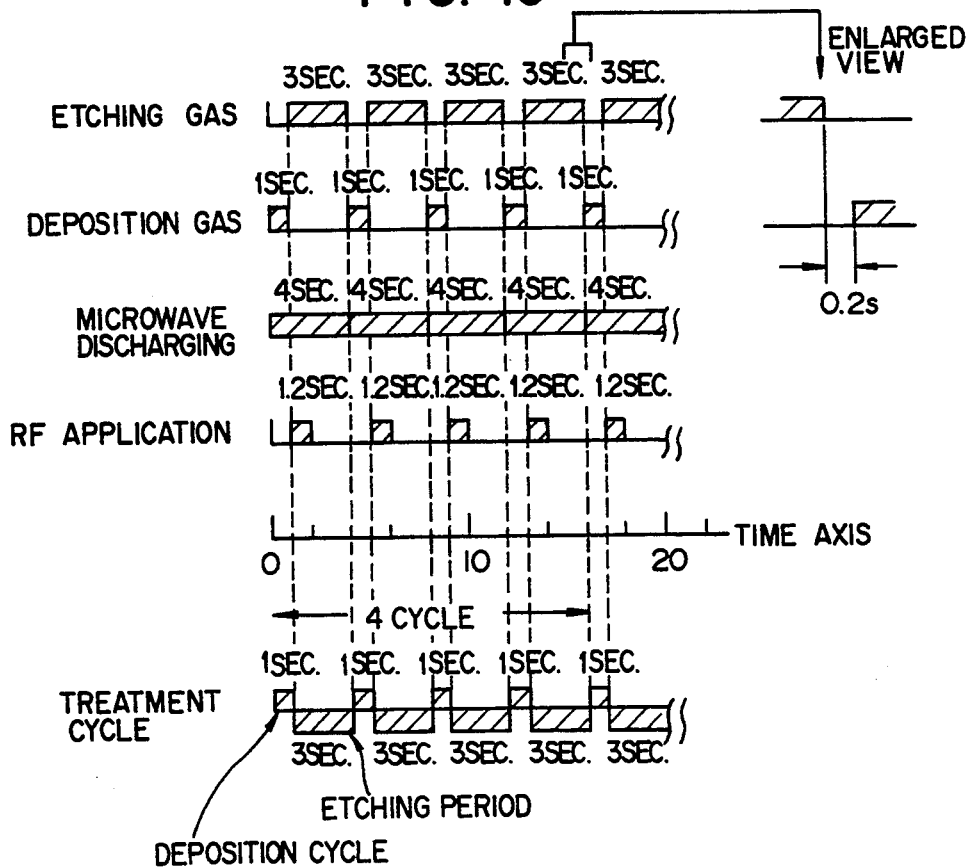
FIG. 10 is a timing chart of the time modulation etching according to the present invention.

The timing chart of one embodiment of the time modulation etching according to the present invention is shown in FIG. 10. In the conventional dry etching apparatus, the microwave discharging was stopped for 9 sec from when supply of the deposition gas was started, whereas in this embodiment, the time while the microwave discharging is stopped may be 0.2 sec or so because the exhaust time of 0.2 sec or so can be realized. So in this embodiment, as seen from the enlarged view, a time interval of 0.2 sec is placed in exchanging the introduction gas from the etching gas to the deposition gas. During this time interval, the gas is swiftly exhausted from the vessel so that even if generation of the microwave power is not stopped, the gas discharging will stop in a short time (about 0.2 sec). It is much shorter than 3 sec of one etching step so that stopping of the discharging due to gas exhaust without stopping generation of the microwave provides negligible influence. Since the power source system is unstable immediately after the microwave generator is turned on/off, continuation of microwave generation can prevent the etching characteristic from deteriorating because of the instability.

Thus, in accordance with this embodiment, the time while the discharging is stopped can be shortened to 0.2 sec from 9 sec in the conventional apparatus. In the conventional apparatus, it took 52 sec to perform four etching cycles, whereas in this embodiment, it takes only 16 sec. Thus, the total time required for etching can be reduced by about 70%. Although polycrystalline Si was used as an etching material, the above effect is true of any etching material to which the time modulation etching can be applied.

Additionally, in this embodiment, the discharging stopping time is as short as 0.2 sec within 4 sec. This provides a problem that a temperature increase in the wafer due to the discharging becomes higher than in the conventional apparatus. Use of electrostatic adsorption as means of fixing the wafer on the sample stage enhances cooling efficiency and does not provide any actual problem. The time of absence of the discharging between the etching cycles may be extended to restrain an increase in the wafer temperature.

Embodiment 7

An explanation will be given of a multi-step etching which is another embodiment of the dry etching technique according to the present invention.

The multi-step etching means an etching in which gas is exchanged during one cycle of etching. For example, in the first step, gas is introduced for anisotropic etching; in the second step, deposition gas is introduced for side wall protection; and in the third step, isotropic etching gas is introduced to remove an etching residue at a level difference or bump.

Also when a wafer is fixed by electrostatic adsorption, the gas is exchanged. When the wafer is electrostatically adsorbed onto the sample stage, or released from the electrostatic adsorption, charges must be stored or discharged within the wafer. A method of moving charges like this is to generate plasma over the wafer.

When the wafer is electrostatically adsorbed on the sample stage, the degree of contact of the wafer with the sample stage is still low. Thermal conductivity is low and the wafer temperature increases by heat from the plasma. Thus, use of the plasma of etching gas for electrostatic adsorption causes side etching. Further, use of the plasma of etching gas for release from the electrostatic adsorption gives rise to a problem of excessive over-etching. For these reasons, it is preferable to use inert gas plasma in attaching or removing the electrostatic adsorption.

In performing three-step etching using the electrostatic adsorption, the gas is exchanged four times. The conventional dry etching required the exhaust time of about 6 sec to exchange the gas once. Thus, 24 sec was required for each wafer for gas exhaust accompanied by the gas exchange. This time is close to the etching time required for each wafer, which is about 30 sec.

In this embodiment, the gas exhaust time is controlled to be 0.2 sec or less so that the time required to exchange the gas once can be made 0.2 sec or less. As a result, the gas exchange can be carried out in 0.8 sec for each wafer. The total etching time can be decreased by 43% from 54 sec to 31 sec, thus improving the throughput.

Embodiment 8

Figure 11:
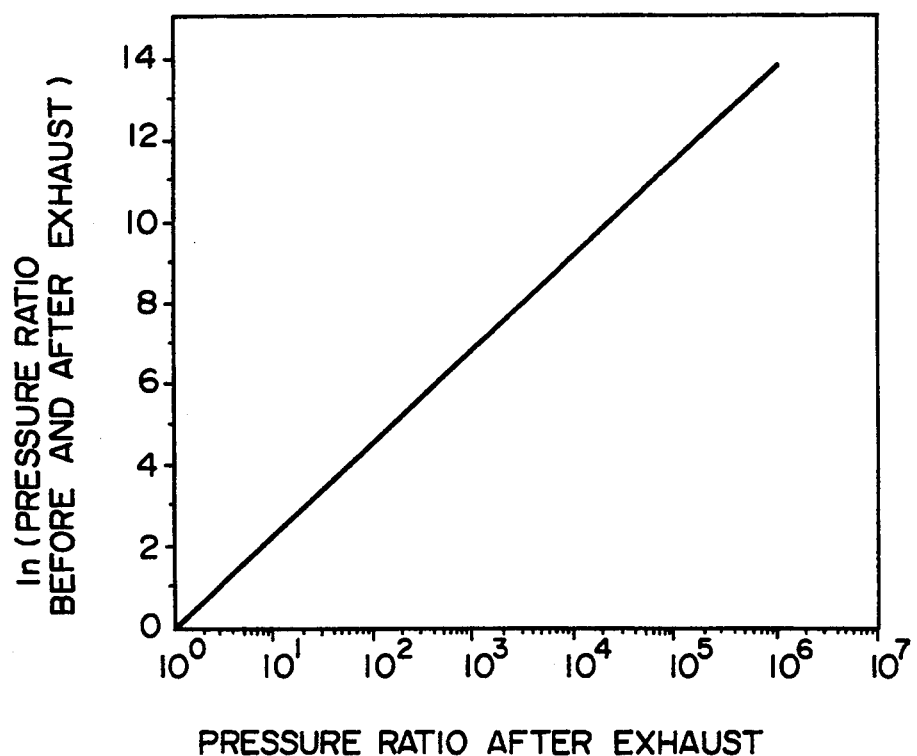
FIG. 11 is a graph showing the relationship of the pressure ratio before and after exhaust and its natural logarithm.

An explanation will be given of another embodiment of the dry etching method according to the present invention. In this embodiment, an etching shape is observed while the etching is performed. In the conventional apparatus, the etching shape was observed using an electron microscope after completion of the etching. Attachment of the electron microscope to the dry etching apparatus permits the etching shape to be observed during the etching. But this requires that the plasma is stopped and the pressure is lowered to 10 $\mu$Torr, preferably 1 $\mu$Torr. With the etching pressure of 1 mTorr, the time taken from when gas introduction is stopped to when the gas is exhausted to 1 $\mu$Torr is about seven times as long as the gas residence time as seen from FIG. 11 because the pressure ratio before and after the exhaustion is 1,000. The conventional dry etching apparatus, in which the gas residence time is 1 sec, requires 10 sec for gas exhaust. Thus, the observation by an electron microscope during etching deteriorates the throughput by the time required for gas exhaust.

In this embodiment, since the gas residence time of 100 ms is given, the gas exhaust time for observation by an electron microscope can be decreased to 0.7 sec or less. Thus, since the time required for gas exhaust is greatly shortened, reduction in the throughput by the observation during etching can be minimized. As a result, etching can be carried out with great accuracy while the etching shape and etching residue are monitored.

The effect by this embodiment can also be obtained in the case where etching is performed while an observation such as surface analysis is made in a high vacuum atmosphere as well as the case where the observation by an electron microscope is made during the etching.

In accordance with the present invention, anisotropic etching can be carried out at a high speed and with high selectivity. Also when a reaction product has low vapor pressure, the etching speed of a mask can be lowered to make high-speed high-selectivity etching.

In accordance with the present invention, by the time modulation etching using a very high speed gas pulse, high etching anisotropy and a flat side wall can be achieved.

In accordance with the present invention, since the time required for gas exchange can be shortened, high anisotropy etching such as time modulation etching and multi-step etching can be made with high throughput.

In accordance with the present invention, the etching can be made with high throughput while the analysis requiring a high vacuum is carried out.

The effect according to the present invention can also be obtained in other apparatuses such as RIE (reactive ion etching), magnetron type RIE and helicon resonance type RIE apparatuses.

We claim:

1. A dry etching method in which at least one etching gas is changed into plasma by discharging, and at least one etching reaction and desorption of at least one reaction product are promoted by incident ions from the plasma, wherein the current density of said incident ions is controlled to be 12 mA/cm$^2$ or more while the etching gas, which is three times as much as the desorption amount of the reaction product, is introduced into a treatment chamber at an effective exhaust speed of at least 1200 liter/s in the chamber.

2. A dry etching method in which different kinds of gases are discharged alternately and periodically, wherein at least one reactive gas and at least one inert gas are discharged alternately.

3. A dry etching method according to claim 2, wherein a bias is applied to a sample to be treated while the inert gas is being discharged.

4. A dry etching method according to claim 2, wherein said reactive gas is a $Cl_2$ gas and the inert gas is a Xe gas.

5. A dry etching apparatus, comprising:
   at least one means for introducing treatment gas into a vacuum treatment chamber;
   at least one gas flow rate control means attached to said treatment gas introducing means;
   means for exhausting gas outside said vacuum treatment chamber;
   means for making at least one exhaust conductance variable to alter the exhaust speed;
   high frequency discharging or microwave discharging means, in which a sample located in said vacuum treatment chamber is treated using the gas plasma generated by said discharging means, wherein said exhaust means is an exhaust pump capable of realizing the effective exhaust speed of 1000 liter/s in the treatment chamber so that the residence time of the treatment gas in said treatment chamber is 100 ms or less; and
   means for controlling the respective operations of said gas flow controlling means, means for altering the exhaust speed, and said discharging means so that the response time in said gas flow rate control means is decreased to 100 ms or below.

6. A dry etching apparatus according to claim 5, wherein introduction of at least one kind of gas is controlled so that it flows cyclically and intermittently at predetermined intervals.

7. In a dry etching apparatus comprising at least one means for introducing treatment gas into a vacuum treatment chamber, at least one gas flow rate control means attached to said treatment gas introducing means, means for exhausting gas outside said vacuum treatment chamber, means for making an exhaust conductance variable to alter the exhaust speed, and high frequency discharging or microwave discharging means, a dry etching method in which a sample located in said vacuum treatment chamber is dry etched using the gas plasma generated by said discharging means, wherein introduction of at least one kind of gas is controlled so that the at least one kind of gas flows cyclically and intermittently at predetermined intervals, and wherein a gas adsorption amount when the gas is introduced once is set for 10 or fewer atomic layers on the surface of the sample.

8. A dry etching apparatus according to claim 5, further comprising means for sample observation.

9. A plasma treatment apparatus, comprising:
   a vacuum chamber having an internal plasma treatment zone for providing a body to be treated,
   means for introducing at least one gas into the vacuum chamber;
   means for producing a gas plasma with the gas, and for providing the gas plasma in the plasma treatment zone; and
   means for exhausting the vacuum chamber at a total pump evacuation speed of greater than 2500 l/sec.

10. A plasma treatment apparatus as claimed in claim 9, wherein the exhaust conductance of said vacuum chamber is more than 2000 l/sec.

11. A plasma treatment apparatus as claimed in claim 9, wherein said gas includes at least one gas for etching the surface of the body.

12. A plasma treatment apparatus as claimed in claim 9, further comprising high frequency electric power generating means, wherein a high frequency electric power is radiated to the plasma treatment zone to generate plasma which is used for etching, and the power surface density of said high frequency electric power to be radiated is 4.5 W/cm$^2$ or more.

13. A plasma treatment apparatus as claimed in claim 9, wherein gas flow in the vacuum chamber is 90 sccm or more.

14. A plasma treatment apparatus as claimed in claim 9, wherein the wall of the vacuum chamber abutting on a discharging part is made of metal, and means for cooling the wall is provided.

15. A plasma treatment apparatus as claimed in claim 9, further comprising high frequency electric power generating means, wherein the surface area of the body is 130 cm$^2$ or more and the maximum output power of the high frequency electric power generating means is 1.3 kW or more.

16. A plasma treatment apparatus as claimed in claim 15, further comprising means for bringing liquid or solid coolant into contact with the back surface of the body.

17. A plasma treatment apparatus as claimed in claim 15, further comprising means for recovering the gas after plasma treatment is completed.

18. A plasma treatment apparatus as claimed in claim 15, wherein plural temperature detection units are provided on a stage on which said body is placed.

19. A plasma treatment apparatus as claimed in claim 9, wherein an SiO$_2$ layer is treated on the body surface.

20. A plasma treatment method, comprising the steps of:
   providing a body to be treated in a vacuum chamber;
   introducing a gas into the vacuum chamber;
   producing a gas plasma with the introduced gas;
   treating the body with the gas plasma; and
   exhausting the vacuum chamber at a total exhaust speed being greater than 2500 l/sec.

21. A plasma treatment method as claimed in claim 20, wherein said exhausting step is carried out at the exhaust conductance of said vacuum chamber of more than 2000 l/sec.

* * * * *